(12) United States Patent
Pesikov

(10) Patent No.: US 8,117,725 B2
(45) Date of Patent: Feb. 21, 2012

(54) METHOD OF MANUFACTURING A PLURALITY OF MOLDED COMPONENTS

(75) Inventor: Vitaly Pesikov, Canton, MA (US)

(73) Assignee: The Gillette Company, Boston, MA (US)

( * ) Notice: Subject to any disclaimer, the term of this patent is extended or adjusted under 35 U.S.C. 154(b) by 694 days.

(21) Appl. No.: 12/262,216

(22) Filed: Oct. 31, 2008

(65) Prior Publication Data

US 2010/0112367 A1    May 6, 2010

(51) Int. Cl.
B21D 39/00 (2006.01)
B23Q 17/00 (2006.01)
B23P 17/00 (2006.01)
B23B 5/00 (2006.01)

(52) U.S. Cl. .......... 29/407.05; 29/418; 29/428; 29/429; 29/527.1; 29/709; 264/297.7; 264/317

(58) Field of Classification Search ............... 29/407.05, 29/418, 429, 527.1, 709, 712, 779, 428, 707, 29/708; 264/297.7, 317
See application file for complete search history.

(56) References Cited

U.S. PATENT DOCUMENTS

| | | | |
|---|---|---|---|
| 2,577,350 A | 12/1951 | Morin | |
| 2,584,916 A | 2/1952 | Poux | |
| 3,068,519 A | 12/1962 | Morin | |
| 4,107,242 A | 8/1978 | Runge | |
| 4,109,821 A | 8/1978 | Lutz | |
| 4,118,365 A | 10/1978 | James et al. | |
| 4,186,161 A | 1/1980 | Ulmschneider et al. | |
| 4,252,586 A | 2/1981 | Scott | |
| 4,261,414 A | 4/1981 | Frenette et al. | |
| 4,277,434 A | 7/1981 | Conway | |
| 4,352,654 A | 10/1982 | Heimberger | |
| 4,383,819 A | 5/1983 | Letica | |
| 4,431,399 A | 2/1984 | Moertel | |
| 4,497,619 A | 2/1985 | Popow | |
| 4,601,323 A | 7/1986 | Doucet et al. | |
| 4,620,958 A | 11/1986 | Wiechard | |
| 4,631,161 A | 12/1986 | Popow | |
| 4,676,732 A | 6/1987 | Letica | |
| 4,806,405 A | 2/1989 | Liebl | |
| 4,818,203 A | 4/1989 | Majerus et al. | |
| 4,828,778 A | 5/1989 | Gelsomini et al. | |
| 4,832,622 A | 5/1989 | Zahn | |
| 4,922,936 A | 5/1990 | Buzzi et al. | |
| 4,925,610 A | 5/1990 | Wessling et al. | |

(Continued)

OTHER PUBLICATIONS

Bregar, Bill. "A Spectrum of reel progress Maxed—out molder to double space with new facility",*Plastics News*, Aug. 26, 1996: pp. 1 and 14.

*Primary Examiner* — Jermie Cozart
(74) *Attorney, Agent, or Firm* — Jay A. Krebs

(57) ABSTRACT

A method of manufacturing a plurality of molded components including (a) providing a carrier to a manufacturing assembly; (b) forming the molded components on the carrier, the molded components having a sacrificial portion secured to the carrier and being movable along the carrier, and a functional portion extending from the sacrificial portion, adjacent sacrificial portions are spaced from one another by a first distance; (c) winding the carrier in a forward direction onto the uptake device; and (d) unwinding the uptake device in a reverse direction such that the carrier and molded components move toward the source device, one of the molded components contacts the latch preventing the molded components from moving in the reverse direction such that adjacent sacrificial portions are moved closer together to a second distance that is less than the first distance.

17 Claims, 5 Drawing Sheets

U.S. PATENT DOCUMENTS

| | | |
|---|---|---|
| 4,946,639 A | 8/1990 | Majerus et al. |
| 5,011,399 A | 4/1991 | Farrell |
| 5,057,259 A | 10/1991 | Parmelee |
| 5,061,173 A | 10/1991 | Julian et al. |
| 5,067,891 A | 11/1991 | Julian et al. |
| 5,143,424 A | 9/1992 | Boucherie |
| 5,147,658 A | 9/1992 | Furukawa et al. |
| 5,148,596 A | 9/1992 | Zahn |
| 5,299,623 A | 4/1994 | Yaffe et al. |
| 5,337,468 A | 8/1994 | Zahn |
| 5,389,331 A | 2/1995 | Uehara et al. |
| 5,428,890 A | 7/1995 | Zahn |
| 5,478,051 A | 12/1995 | Mauer |
| 6,003,676 A | 12/1999 | Beyer |
| 7,134,197 B2 | 11/2006 | Shiffer et al. |
| 7,164,841 B2 | 1/2007 | Lefebvre |

METHOD OF MANUFACTURING A PLURALITY OF MOLDED COMPONENTS

FIELD OF THE INVENTION

The invention relates to molded components and a method of manufacturing and handling the molded components

BACKGROUND OF THE INVENTION

Molded components, particularly micro-molded components, present challenges that arise in the context of transporting, storing, feeding and handling such components through manufacturing systems. These challenges are particularly associated with the difficulty of gripping and securing these components due to their small size and the force of static electricity, which makes the components stick to production equipment, i.e., to storage trays and/or magazines, or even to one another.

The electronics industry uses plastic and metal component carriers quite frequently. For example, U.S. Pat. No. 5,148,596 describes a continuous molded electronic component assembly process in which a continuous line of components is supplied on reels for assembly and insertion. U.S. Pat. No. 6,003,676 describes a carrier tape formed with a plurality of product receiving pockets molded thereon. U.S. Pat. No. 7,134,197 describes a method such that plastic parts can be transported on a carrier for manufacturing of a final product based initially on the plastic part.

However, there still exists a need to provide molded components and a method that overcomes the above-mentioned problems associated with transporting, storing, feeding and handling molded components.

SUMMARY OF THE INVENTION

In an aspect, the invention features a method of manufacturing a plurality of molded components. The method includes: (a) providing a carrier to a manufacturing assembly, the manufacturing assembly comprising a source device and an uptake device, both being adapted for winding and unwinding, and a latch; (b) forming a plurality of molded components on the carrier, the molded components comprising a sacrificial portion being secured to a carrier and being movable along the carrier, the sacrificial portion having a bottom surface and a top surface, and a functional portion extending from the sacrificial portion, adjacent first portions are spaced from one another by a first distance; (c) winding the carrier in a forward direction onto the uptake device; and (d) unwinding the uptake device in a reverse direction such that the carrier and molded components move toward the source device, one of the molded components contacts the latch preventing the molded components from moving in the reverse direction such that adjacent sacrificial portions are moved closer together to a second distance that is less than the first distance.

In another implementation, the invention features a molded component, comprising a sacrificial portion secured to a carrier and being movable along the carrier, and a functional portion extending from the sacrificial portion.

In yet another aspect, the invention features a plurality of molded components comprising a first molded component having a sacrificial portion and a functional portion, the sacrificial portion being secured to a carrier and being movable along the carrier, the sacrificial portion having a bottom surface and a top surface, and the functional portion extending from the sacrificial portion, and a second molded component having a sacrificial portion and a functional portion, the sacrificial portion being secured to a carrier and being movable along the carrier, the sacrificial portion having a bottom surface and a top surface, and the functional portion extending from the sacrificial portion, wherein the top surface of the first molded component interlocks with the bottom surface of the second molded component.

Certain implementations of the invention may include one or more of the following features. The manufacturing assembly is a reel-to-reel mechanism. The molded component includes a second functional portion that extends from the sacrificial portion such that the functional portions may be the same or different from one another. The carrier may be selected from the group consisting of a wire, polymeric monofilament, synthetic fiber, nylon and combinations thereof. Other suitable carriers can be used. Utilizing this type of carrier allows the carrier to twist or turn, but does not affect the molding process.

The invention described herein overcomes the problems associated with the prior art by supplying a carrier that is fed through a mold in such a way that a molded component is secured to the carrier as it is molded. The carrier with the molded component on it is then collected onto an uptake device or reel, which, in turn, is filled with parts to be delivered to the next manufacturing process.

The invention reduces the cost of manufacturing because it provides for a carrier that can be re-used, instead of discarding it after a single use. Additionally, a separator strip is no longer needed to protect the parts from each other. The invention allows neighboring sacrificial portions to contact each other, but the functional portions that will be used in the product do not contact each other, thereby minimizing damage, i.e., overall cost, to the functional portion. Furthermore, cost reduction is evident because the carrier no longer needs to be indexed to assure alignment with the mold. Forming the molded component directly on the carrier not only eliminates indexing, it also assures secure attachment and reduces the likelihood that the molded component will be damaged. The molded component is no longer limited to a flat, two-dimensional shape because the molded component is easily movable along the carrier and the layers on reels are stable. Furthermore, the carrier of the invention allows for less stringent tolerances and thicknesses, thereby reducing cost.

Other features and advantages of the invention will be apparent from the description and drawings, and from the claims.

DETAILED DESCRIPTION OF THE INVENTION

Figure 1:
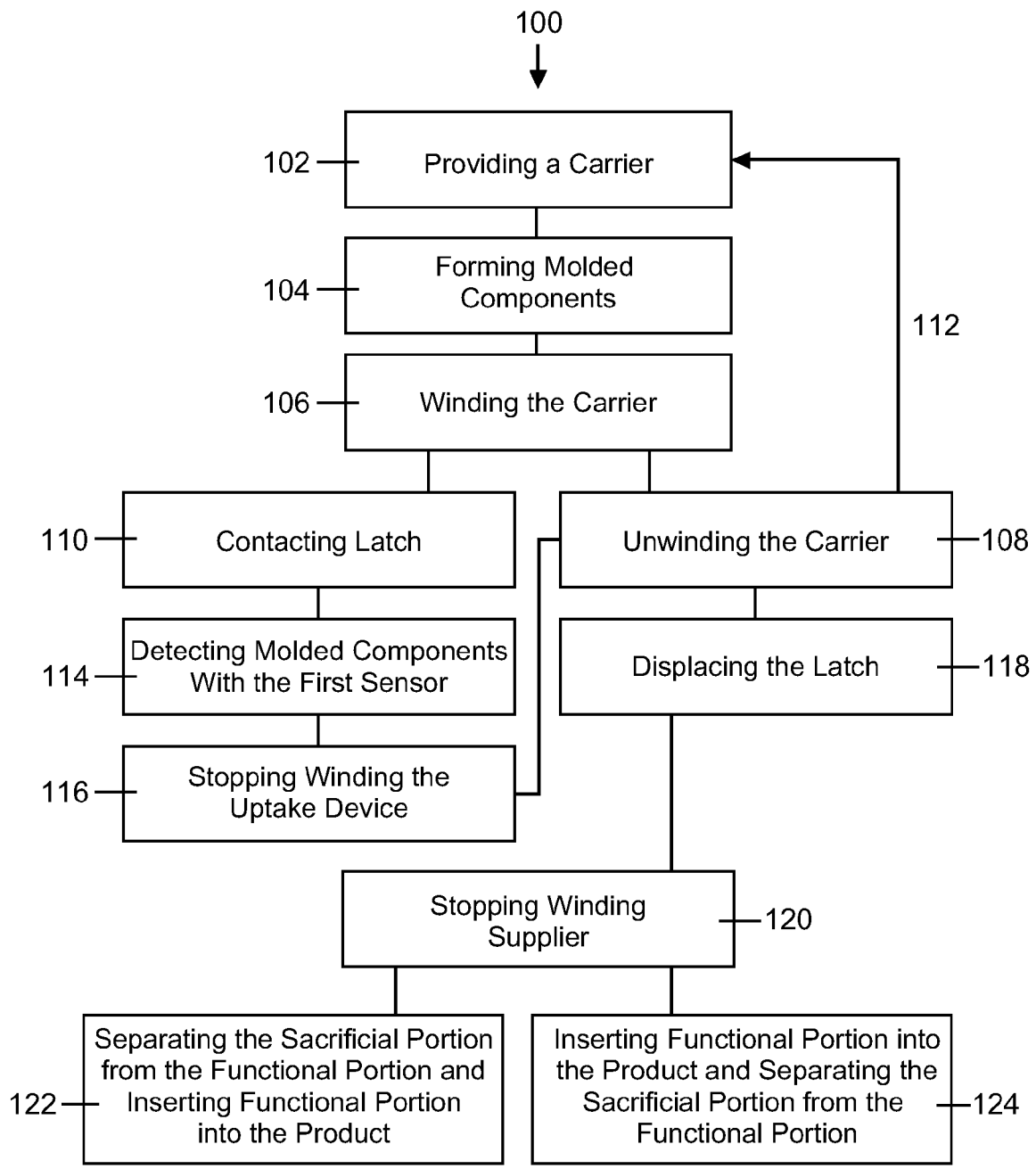
FIG. 1 is a flowchart of a manufacturing method for making molded components.

FIG. 1 shows a method of manufacturing a plurality of molded components (100). First, a carrier is provided to a manufacturing assembly (102). The manufacturing assembly includes a source device and an uptake device, both being adapted for winding and unwinding, and a latch. Then, the molded components are formed on the carrier (104). The molded components have a sacrificial portion, which is secured to the carrier and movable along the carrier, and a functional portion that extends from the sacrificial portion such that adjacent sacrificial portions of the molded components are spaced from one another by a first distance. Next, the carrier is wound in a forward direction onto the uptake device (106).

Then, the carrier is unwound from the uptake device in a reverse direction such that the carrier and molded components move toward the source device (108). One of the molded components contacts the latch preventing the molded components from moving in the reverse direction, but allows the carrier to continue to move toward the source device. The adjacent sacrificial portions are moved closer together to a second distance that is less than the first distance. The preceding steps can be repeated (112) to produce additional molded components.

In an embodiment, as the uptake device is being wound, the molded components may contact the latch (110) as the carrier moves toward the uptake device. Alternatively, a first sensor may be used for detecting the molded components (114) as they move forward. Upon detection by the first sensor, the uptake device stops winding (116).

After the molded component stops, the carrier continues moving toward the source device. After the slack in the carrier has been taken out from stopping the molded components, the resistance to pulling the carrier increases and will eventually displace the latch upon reaching or exceeding a threshold value (118). The threshold value is related to the total number of molded components required to be moved and the force required to overcome the static friction force of each component on the carrier. A second sensor may be used for detecting displacement of the latch by the molded components. Once the latch becomes displaced, a signal is sent to the source device to stop winding (120). For example, the signal may not only be derived from displacement of the latch, but also lapse of time, or some other condition.

Ultimately, the functional portion of the molded component will be utilized in an assembled product. In an embodiment, the functional portion is first separated from the sacrificial portion and inserted into the product (122). Alternatively, the functional portion can be inserted into the product and then separated from the sacrificial portion (124).

The manufacturing assembly (200), shown in FIGS. 2A-2D and FIG. 3, may be used to manufacture the plurality of molded components (401). The manufacturing assembly (200) comprises a carrier (202) in communication with a source device (204) and an uptake device (206), a latch (208), and a molding assembly (400) for forming a plurality of molded components (401) on the carrier (202). The source device (204) and uptake device (206) are adapted for winding and unwinding. The molded components (401) have a sacrificial portion (402) and a functional portion (404). The sacrificial portion (402) is secured to and movable along the carrier (202) whereas the functional portion (404) extends from the sacrificial portion (402) such that adjacent sacrificial portions are spaced from one another by a first distance (408).

In an embodiment, the manufacturing assembly (200) is a reel-to-reel device. The carrier (202) may be selected from the group consisting of a wire, monofilament, polyester, synthetic fiber, nylon, and combinations thereof. Other suitable carriers can be used. The carrier (202) may be a single strand, tape, or band of material or braided/twisted into a single strand, tape, or band.

Figure 2A:
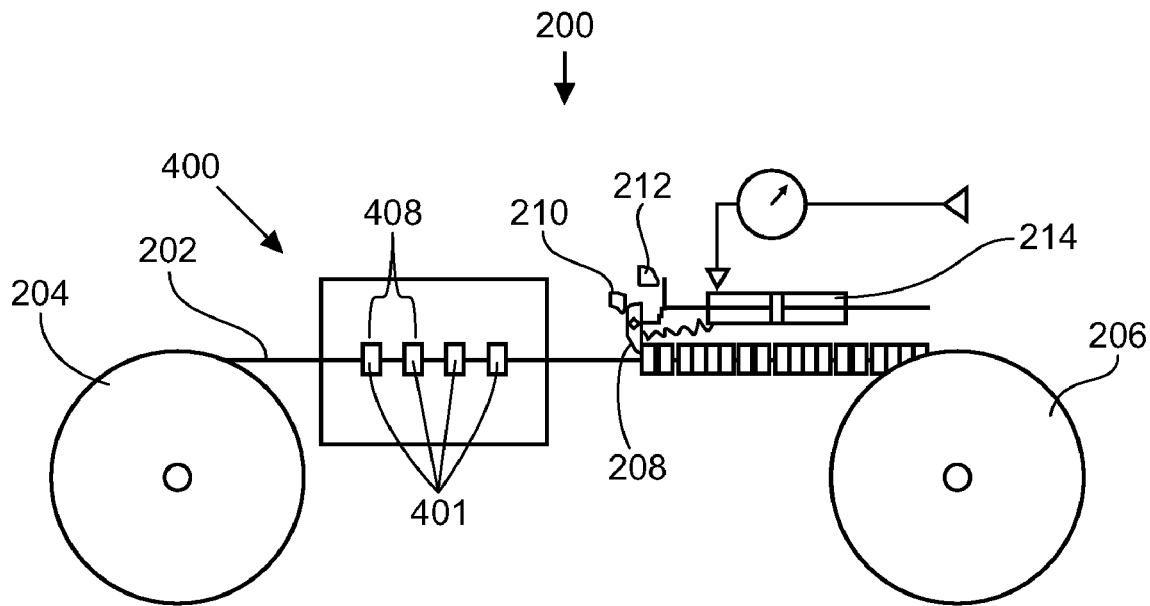
FIG. 2A is a diagrammatic plan view of a manufacturing assembly for performing some of the steps of the manufacturing method of FIG. 1.
Figure 2B:
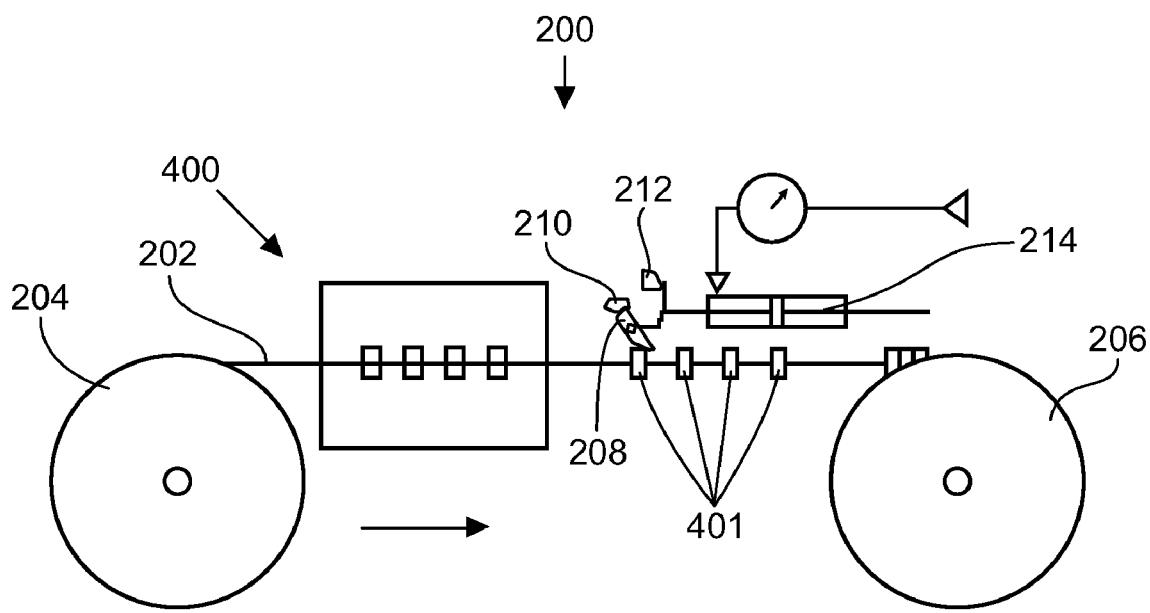
FIG. 2B is a diagrammatic plan view of a manufacturing assembly for performing some of the steps of FIG. 1.
Figure 2C:
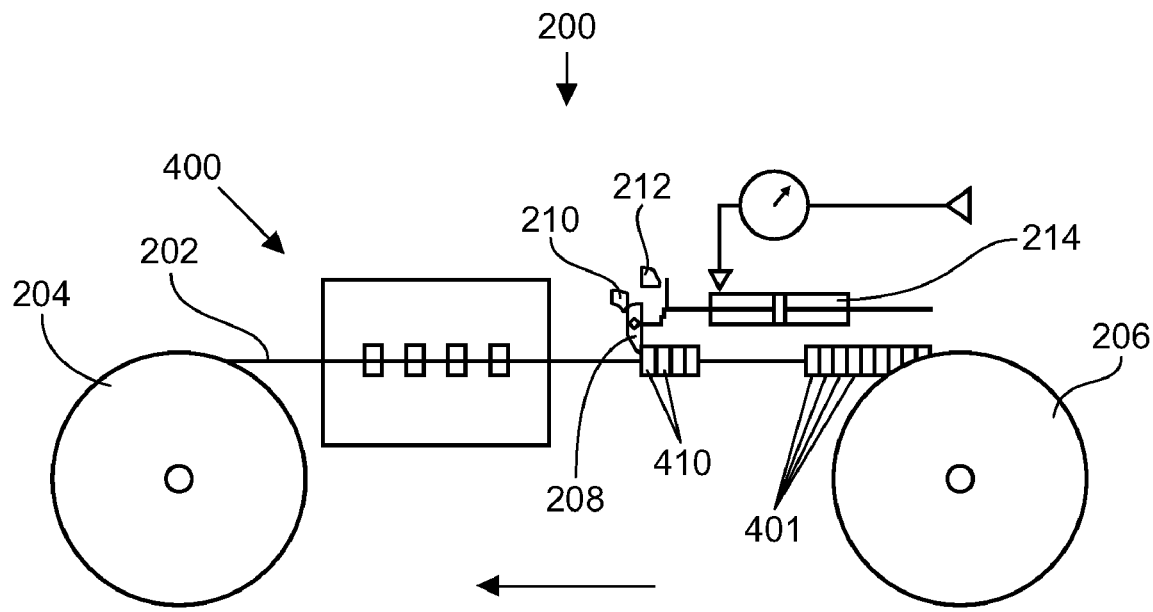
FIG. 2C is a diagrammatic plan view of a manufacturing assembly for performing some of the steps of the manufacturing method of FIG. 1.
Figure 2D:
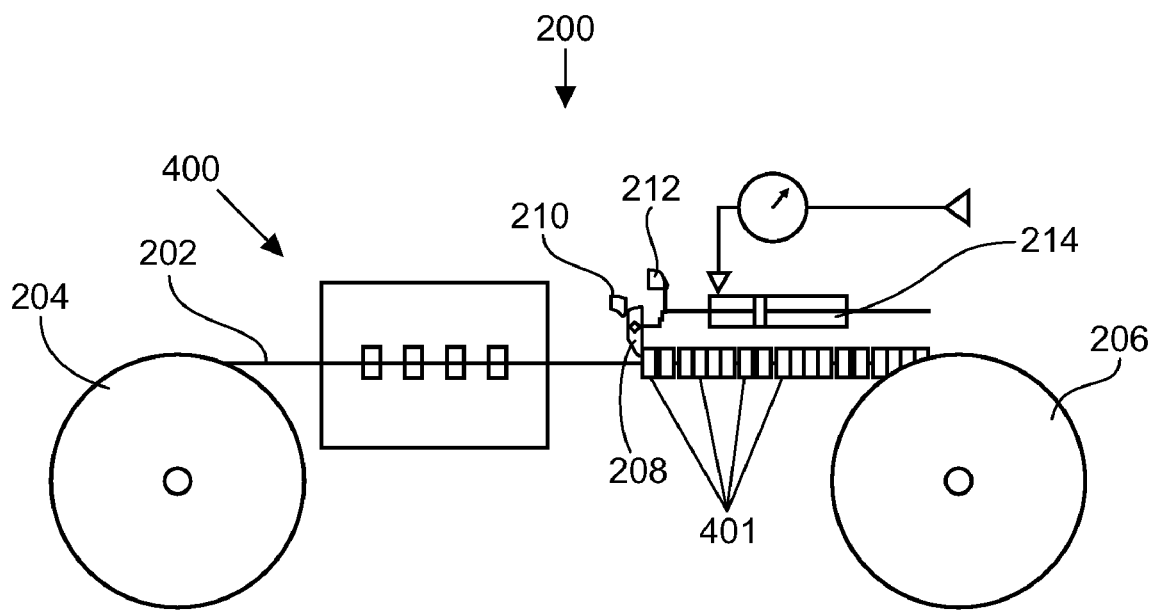
FIG. 2D is a diagrammatic plan view of a manufacturing assembly for performing some of the steps of the manufacturing method of FIG. 1.

As the uptake device (206) is wound, shown in FIGS. 2A and 2B, the carrier (202) with the molded components (401) attached moves forward toward the uptake device (206). In an embodiment, the molded components (401) contact the latch (208) as the carrier (202) moves toward the uptake device (206). The manufacturing assembly (200) may also include a first sensor (210) that is in communication with the uptake device (206). The first sensor (210) may be used to detect the molded components (401) as well as send a signal to the uptake device (206) to stop winding.

Referring now to FIGS. 2A-2D and FIG. 6, the uptake device (206) unwinds the carrier (202) causing the molded components (401) to move toward the source device (204) in a reverse direction. The molded components (401) are prevented from moving to the source device (204) by the latch (208), but the carrier (202) continues moving toward the source device (204). Preventing further movement of the molded components (401) allows the molded components (401) to compact together such that adjacent sacrificial portions (402a, 402b) are spaced from one another by a second distance (410) that is less than the first distance (408). This decrease in distance between molded components provides for neighboring sacrificial portions (402a, 402b) to be in close proximity to one another allowing for more efficient storing in a horizontal direction as well as stacking in a vertical direction.

A force control mechanism (214) may be connected to the latch (208) that is adapted for applying tension to the latch (208) as well as biasing the latch (208) between a normal position and a displaced position. The force control mechanism may be a spring, an air cylinder, or any other suitable mechanism. The amount of tension applied to the latch (208) has a threshold value relative to the total number of molded components (401) required to be moved and the force required to overcome the static friction force of each individual molded component (401) on the carrier (202). After the slack in the carrier (202) has been taken out from stopping the molded components (401), the resistance to pulling the carrier (202) increases and will eventually displace the latch (208) upon reaching or exceeding the threshold value. Once the latch (208) becomes displaced, a signal is sent to the source device (204) to stop winding. In an embodiment, a second sensor (212) may be used for detecting displacement the latch (208) by the molded components (401).

A compacting device (not shown) may also be included on the manufacturing assembly (200) for sliding the molded component (401) along the carrier (202) thereby separating and reducing the space between the sacrificial portions (402a, 402b, 402c). In an embodiment, the molded components (401) are tapered, which further aids in stacking the multiple molded components (401). In either case, the neighboring functional portions (404a, 404b, 404c) are not in contact allowing for storage without damaging the functional portions (404a, 404b, 404c) that will be later utilized in an assembled product. The functional portion (404) may be first separated from the sacrificial portion (402) and inserted into the product or the functional portion (404) can be inserted into the product and then separated from the sacrificial portion (402).

Figure 3:
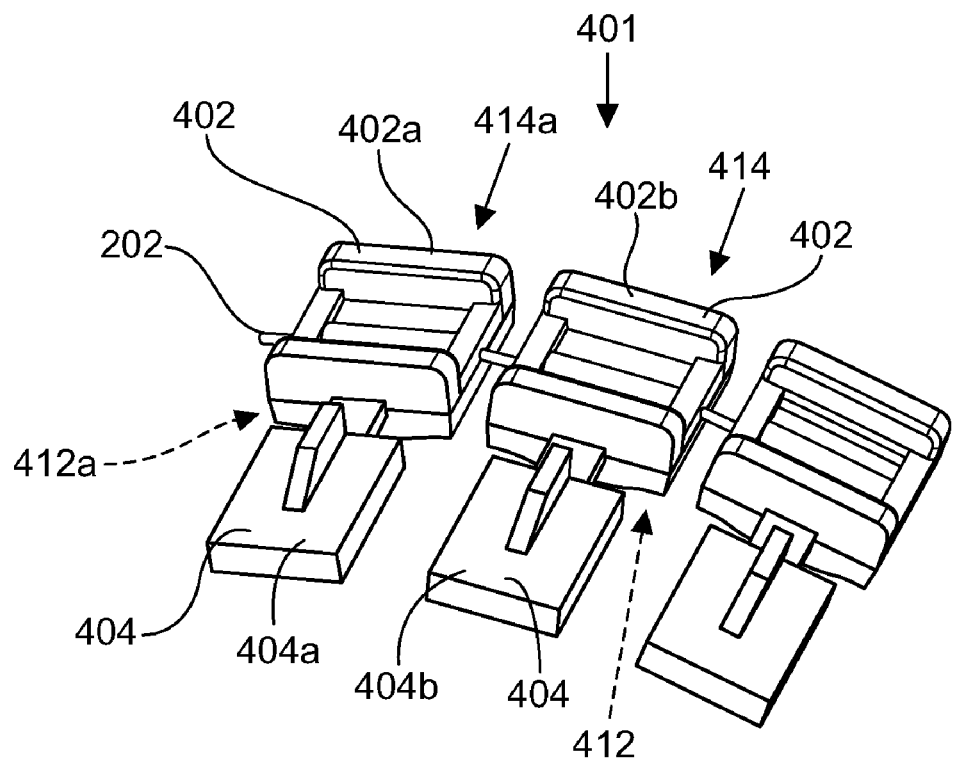
FIG. 3 is a view of a molded component.
Figure 4:
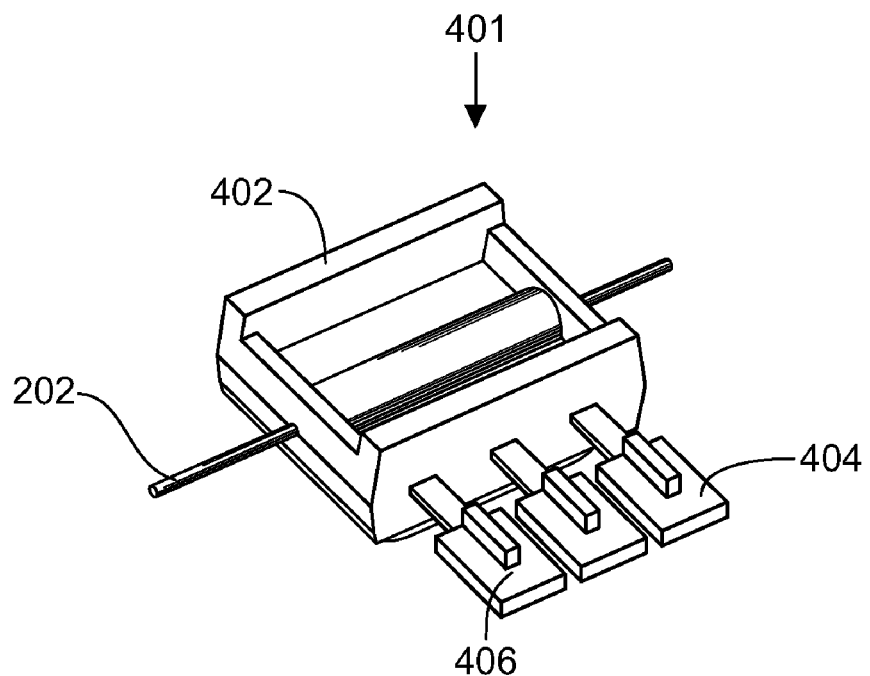
FIG. 4 is a view of an alternative embodiment of a molded component.
Figure 5:
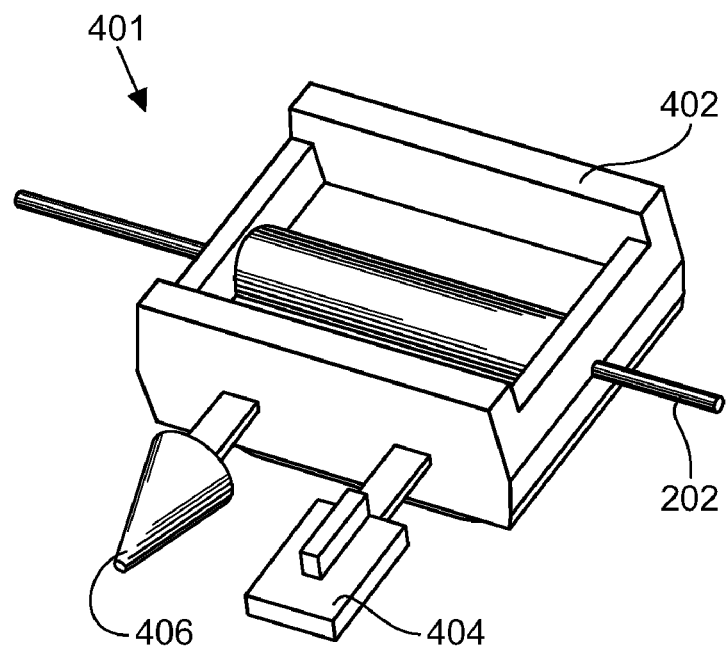
FIG. 5 is a view of another alternative embodiment of a molded component.

Referring now to FIG. 3, the molded components (401) have a sacrificial portion (402) secured to a carrier (202) and a functional portion (404) extending from the sacrificial portion (402). The sacrificial portion (402) is secured to and movable along the carrier (202) and has a bottom surface (412) and a top surface (414). Referring now to FIGS. 4 and 5, the molded components (401) secured to carrier (202) comprise a sacrificial portion (402), a functional portion (404), and a second functional portion (406) extending therefrom. The functional portion (404) and second functional portion (406) can be the same, as shown in FIG. 4, or can be different from one another, as shown in FIG. 5.

Figure 6:
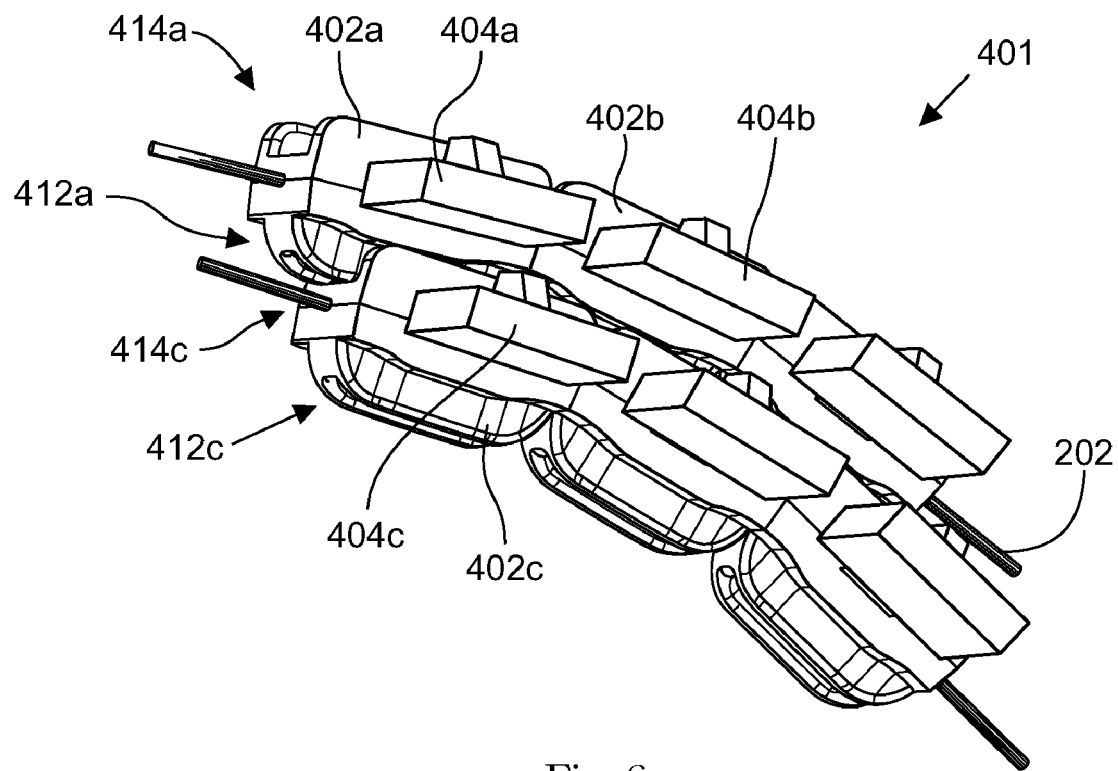
FIG. 6 is a view of a plurality of molded components on the uptake device.

Referring to FIG. 6, the plurality of molded components (401) have sacrificial portions (402a, 402c) secured to a carrier (202) that are movable along the carrier (202), bottom surfaces (412a, 412c) and top surfaces (414a, 414c), and functional portions (404a, 404c) that extend from the sacrificial portions (402a, 402c). The top surface (412c) of the first molded component (401) interlocks with the bottom surface (412a) of the second molded component (401) such that the first functional portion (404a) and the second functional portion (404c) are spaced apart from each other. In an embodiment, the sacrificial portion (402) may be tapered, which biases the sacrificial portion (402) toward the carrier (202), and allows for more efficient packing and storing of the molded components (401). The sacrificial portions (402a, 402c) are shaped such that they not only interlock as they are wound onto the uptake device (206), but also are easily separated from one another, as they are unwound.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross-referenced or related patent or application, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method of manufacturing a plurality of molded components, comprising:
    (a) providing a carrier to a manufacturing assembly, the manufacturing assembly comprising:
        a source device and an uptake device, both being adapted for winding and unwinding; and
        a latch,
    (b) forming a plurality of molded components on the carrier, the molded components comprising:
        a sacrificial portion being secured to a carrier and being movable along the carrier, the sacrificial portion having a bottom surface and a top surface; and
        a functional portion extending from the sacrificial portion;
    (c) winding the carrier in a forward direction onto the uptake device; and
    (d) unwinding the uptake device in a reverse direction such that the carrier and molded components move toward the source device, one of the molded components contacts the latch preventing the molded components from moving in the reverse direction such that adjacent sacrificial portions are moved closer together to a second distance that is less than a first distance.

2. The method of claim 1, further comprising the step of (e) contacting the latch with a molded component during step (c).

3. The method of claim 1, wherein a molded component further comprises a second functional portion extending from the sacrificial portion.

4. The method of claim 3, wherein the functional portion and the second functional portion are different from one another.

5. The method of claim 1, wherein the method further comprises repeating steps (b)-(d).

6. The method of claim 1, wherein the manufacturing assembly further comprises a first sensor in communication with the uptake device and the step of (f) detecting the molded component with the first sensor.

7. The method of claim 6, further comprising the step of (g) stopping the winding of the uptake device upon detecting a molded component.

8. The method of claim 1, wherein the manufacturing assembly further comprises a force control mechanism for providing tension to the latch.

9. The method of claim 8, wherein the tension applied to the latch has a threshold value relative to the total number of molded components required to be moved and the force required to overcome the static friction force of each component on the carrier.

10. The method of claim 9, further comprising the step of (h) displacing the latch upon reaching or exceeding the threshold value.

11. The method of claim 10, wherein the manufacturing assembly further comprises a second sensor in communication with the source device and the step of (i) stopping the winding of the source device upon displacement of the latch.

12. The method of claim 1, wherein the first portion of a molded component is tapered.

13. The method of claim 1, wherein the carrier is selected from the group consisting of a wire, polymeric monofilament, synthetic fiber, nylon and combinations thereof.

14. The method of claim 1, wherein the manufacturing assembly comprises a reel-to-reel mechanism.

15. The method of claim 1, further comprising the step of (j) separating the sacrificial portion from the functional portion and inserting the functional portion into a product.

16. The method of claim 1, further comprising steps of (k) inserting the functional portion into a product and separating the sacrificial portion from the functional portion.

17. The method of claim 1, wherein the top surface of a first molded component interlocks with the bottom surface of a second molded component.

* * * * *